(12) United States Patent
Hsiao et al.

(10) Patent No.: US 7,135,731 B2
(45) Date of Patent: Nov. 14, 2006

(54) VERTICAL DRAM AND FABRICATION METHOD THEREOF

(75) Inventors: Ching-Nan Hsiao, Kao-Hsiung Hsien (TW); Ying-Cheng Chuang, Tao-Yuan Hsien (TW); Chi-Hui Lin, Nan-Tou Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/707,396

(22) Filed: Dec. 10, 2003

(65) Prior Publication Data

US 2005/0127422 A1    Jun. 16, 2005

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/301; 257/302; 257/303; 257/304; 257/305; 257/905; 257/906; 257/908

(58) Field of Classification Search ........ 257/301–306, 257/905–906, 908
See application file for complete search history.

(56) References Cited

U.S. PATENT DOCUMENTS

| | | | |
|---|---|---|---|
| 5,519,236 A * | 5/1996 | Ozaki | 257/302 |
| 5,937,296 A * | 8/1999 | Arnold | 438/270 |
| 6,163,045 A * | 12/2000 | Mandelman et al. | 257/301 |
| 6,236,079 B1 * | 5/2001 | Nitayama et al. | 257/306 |
| 6,420,228 B1 * | 7/2002 | Roesner et al. | 438/244 |
| 6,437,388 B1 * | 8/2002 | Radens et al. | 257/301 |
| 6,552,382 B1 * | 4/2003 | Wu | 257/305 |
| 6,605,838 B1 * | 8/2003 | Mandelman et al. | 257/305 |
| 6,747,306 B1 * | 6/2004 | Dyer | 257/302 |

* cited by examiner

*Primary Examiner*—Douglas W. Owens
*Assistant Examiner*—Samuel Gebremariam
(74) *Attorney, Agent, or Firm*—Winston Hsu

(57) ABSTRACT

A vertical DRAM and fabrication method thereof. The vertical DRAM has a plurality of memory cells on a substrate, and each of the memory cells has a trench capacitor, a vertical transistor, and a source-isolation oxide layer in a deep trench. The main advantage of the present invention is to form an annular source diffusion and an annular drain diffusion of the vertical transistor around the sidewall of the deep trench. As a result, when a gate of the transistor is turned on, an annular gate channel is provided. The width of the gate channel of the present invention is therefore increased.

14 Claims, 10 Drawing Sheets

VERTICAL DRAM AND FABRICATION METHOD THEREOF

BACKGROUND OF INVENTION

1. Field of the Invention

The invention relates to a vertical DRAM and a fabrication method thereof, and more particularly, to a vertical DRAM with annular sources/drains and annular channels and a fabrication method thereof.

2. Description of the Prior Art

With the development of modern technology, integration circuits and electrical products have been pushed for size reductions to match the trend of high integration and high density. In a conventional planar trench capacitor DRAM, the source, gate, and drain of a MOS transistor are horizontally located on the surface of the substrate. The distance between the source and the drain determines the length and width of the channel of the gate, which is an important factor affecting the design of the size of the MOS transistor. In a conventional design, the distance between the source and drain occupies larger area and may limit the improvement of the integrations of the semiconductor elements. Therefore a vertical transistor structure is produced.

Generally speaking, the fabrication of a vertical transistor structure involves etching the substrate for producing a deep trench, fabricating a trench capacitor in the deep trench, and locating the drain, gate, and source vertically in the deep trench so that a vertical channel is formed in the upper portion of the deep trench to reduce the horizontal area per transistor. Since a plurality of vertical transistors arranged in a matrix form a vertical DRAM, the vertical transistor can raise the integration of the semiconductor elements. The prior-art fabrications of the vertical DRAM have been disclosed in U.S. Pat. Nos. 6,583,462 and 6,608,168.

However, the prior-art vertical DRAM has a disadvantage that the width of the channel is too narrow, especially when the size of the trench capacitor is smaller 0.1 μm. A narrow width of the channel may cause the sufficient current to be too small, resulting in a bad performance of the DRAM. According to the prior-art vertical DRAM, after fabricating the capacitor and transistor in the deep trench, most of the upper portion of the deep trench is removed for forming the shallow trench isolation (STI) and defining the active area. Therefore the gate conductive layer, drain, and source of the transistor, and even the capacitor, can only use a portion of the sidewall of the deep trench. As result, the size of the gate conductive layer, drain, and source fix the width of the channel, formed as the transistor opening, in a small portion of the sidewall of the deep trench.

SUMMARY OF INVENTION

It is therefore a primary objective of the claimed invention to provide a vertical DRAM with wider channels of transistors and a related fabrication method to solve the above-mentioned problem.

According to the claimed invention, the vertical DRAM comprises a substrate with at least a deep trench, a trench capacitor, a source-isolation oxide layer, and a vertical transistor. The deep trench has an upper trench portion and a lower trench portion separated by the source-isolation oxide layer. The trench capacitor is located in the lower trench portion of the deep trench. The trench capacitor comprises a storage node, a capacitor dielectric layer, and a buried plate. The vertical transistor comprises an annular source, an annular drain, a gate conductive layer, and a cylindrical gate dielectric layer. The annular source is located in the substrate next to the source-isolation oxide layer and circularly encompasses the sidewall of the deep trench. In addition, the annular source is electrically connected to the storage node. The gate conductive layer is filled in the upper trench portion and electrically connected to a first contact plug. The cylindrical gate dielectric layer is located on the surface of the sidewall above the source-isolation oxide layer between the gate conductive layer and the substrate. The annular drain circularly encompasses the deep trench near the surface of the substrate and is electrically connected to a second contact plug.

It is an advantage of the claimed invention that each of the deep trenches only contains a memory cell of the present invention vertical DRAM, so that the vertical transistor of each of the memory cells can sufficiently utilize the sidewall of the deep trench for arranging an annular source and an annular drain. Therefore the channel formed when the gate is opened can also have a circular shape as the annular source and drain. The annular channel has an obviously wider width so that the sufficient current of the transistor is raised to match the requirement of DRAM and increase the yield of products. Furthermore, the capacitor and the transistor of a memory cell of the present invention are all filled in the deep trench, and the contact holes for locating contact plugs are fabricated by a self-alignment process, so that the spacing of the occupied area of each of the memory cells can be reduced to further increase the integration of the DRAM.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
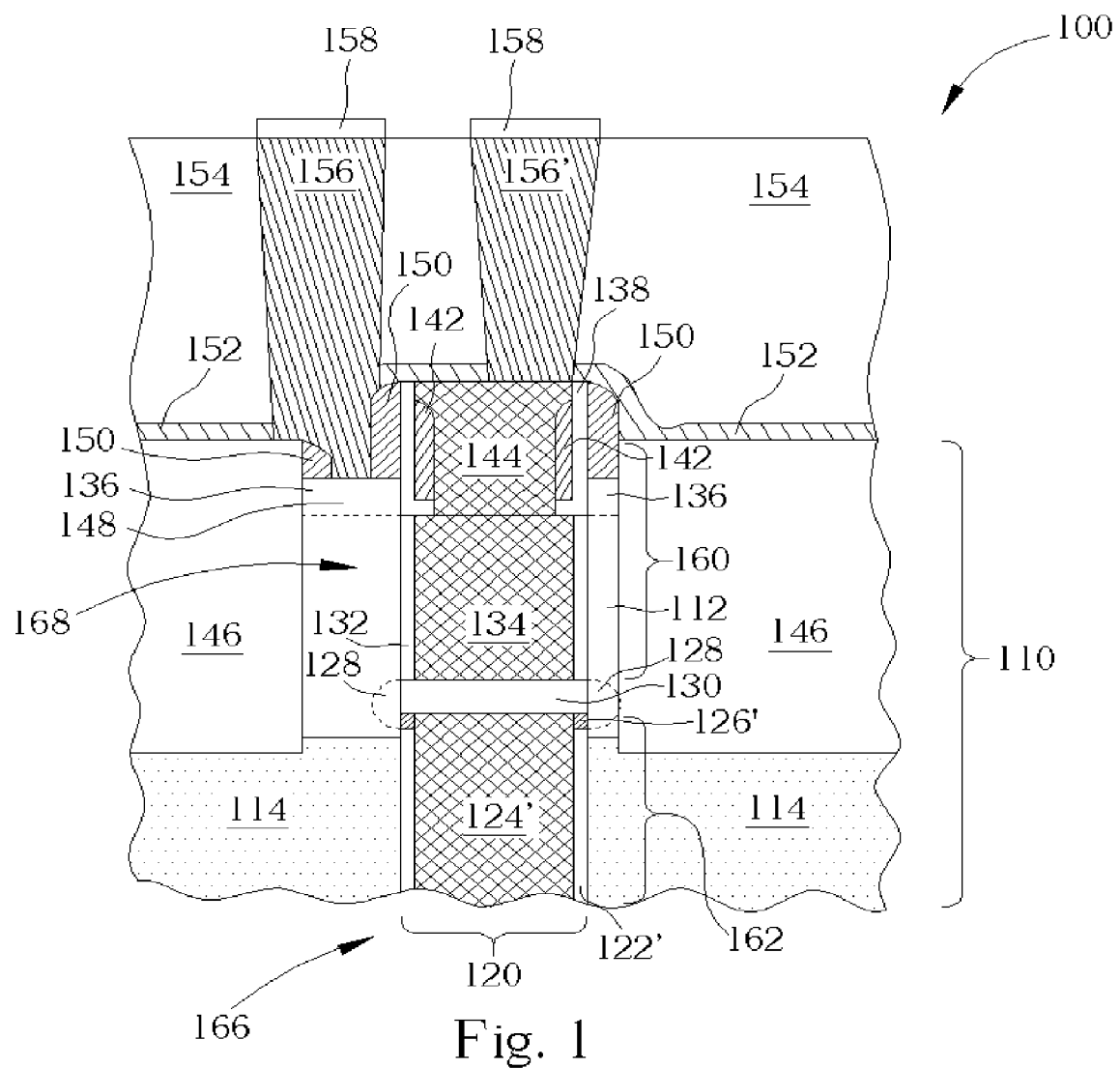
FIG. 1 is a schematic diagram of a vertical DRAM according to a preferable embodiment of the present invention vertical DRAM.
Figure 2:
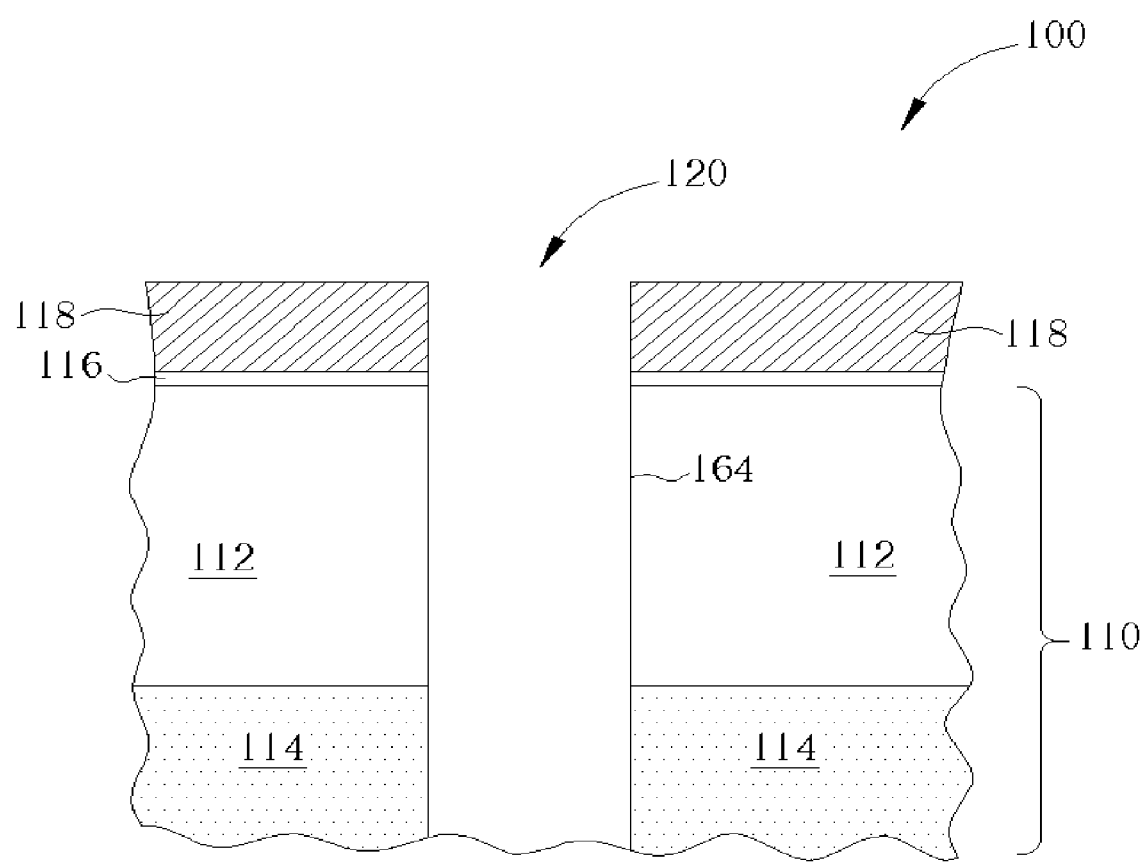
FIG. 2 to FIG. 10 are schematic diagrams of the fabrication method of the vertical DRAM shown in FIG. 1 according to the present invention.

Please refer to FIG. 1. FIG. 1 is a schematic diagram of a vertical DRAM 100 according to a preferable embodiment of the present invention vertical DRAM. The vertical DRAM 100 comprises a substrate 110 with a plurality of deep trenches 120, a trench capacitor 166 formed in an lower trench portion 162 of the deep trench 120, a vertical transistor 168 formed in an upper trench portion 160 of the deep trench 120, and a source-isolation oxide layer 130 between the vertical transistor 168 and the trench capacitor 166 for isolating the vertical transistor 168 and the trench capacitor 166. The substrate 110 further comprises a P-type well 112. The deep trench 120 locates from the surface of the substrate 110 through the P-type well 112 and extends downward. Each of the memory cells of the vertical DRAM 100 locates in a deep trench 120. The drain and gate of the vertical transistor of each memory are electrically connected to a bit line and a word line (not shown) arranged on the substrate to form the memory matrix. For illustrating the present invention, FIG. 1 only shows one deep trench 120. The deep trench 120 has an upper trench portion 160 and a lower trench portion 162 approximately separated by the source-isolation oxide layer 130. The deep trench 120 also has a trench sidewall 164. In addition, the substrate 110 further comprises a STI 146 located surrounding the deep trench 120 for isolating the memory cell in the deep trench 120. As shown in FIG. 1, STI 146 does not overlap the deep trench 120.

The trench capacitor 166 comprises a capacitor dielectric layer 122' covering the surface of the trench sidewall 164 of the lower trench portion 162, a storage node 124' filling the lower trench portion 162, a buried plate 114 located in the substrate 110 surrounding the lower trench portion 162, and a buried strap 126' located above the capacitor dielectric layer 122' and electrically connected to the storage node 124' and the annular source 128, wherein the capacitor dielectric layer 122' isolates the storage node 124' and the buried plate 114. The source-isolation oxide layer 130 is located above the storage node 124', the buried strap 126', and the capacitor dielectric layer 122'. And the source-isolation oxide layer 130 separates the trench capacitor 166 from the elements in the upper trench portion 160.

The vertical transistor 168 comprises an annular source 128 located in the substrate 110 next to the source-isolation oxide layer 130 and circularly encompassing the deep trench 120, a gate conductive layer 134 filling the upper trench portion 160, a cylindrical gate dielectric layer 132 circularly encompassing the gate conductive layer 134, and an annular drain 148. The annular source 128 is electrically connected to the buried strap 126'. In this embodiment, the annular source 128 is an ion diffusion area. The gate conductive layer 134 is electrically connected to a polysilicon conductive layer 144. The polysilicon conductive layer 144 is surrounded by the spacers 142, 150 formed by silicon nitride, a passivation layer 152, and a liner oxide layer 138 formed by silicon oxide for isolating the polysilicon conductive layer 144. As shown in FIG. 1, the polysilicon conductive layer 144 is electrically connected to a contact plug 156' for controlling the vertical transistor 168. The annular drain 136 is a heavily doped ion implantation area located in the substrate 110 near the liner oxide layer 138 and circularly encompasses the trench sidewall 164. The annular drain 136 is electrically connected to a contact plug 156 for transferring bit line signals.

The present invention vertical DRAM 100 further comprises a passivation layer 152 for protecting the elements in the substrate 110, an inter layer dielectric(ILD) layer 154 covering the substrate 110, contact plugs 156 and 156' set in the ILD layer 154 respectively electrically connected to the annular drain 148and the polysilicon conductive layer 144, and a plurality of metal lines 158 electrically connected to the contact plugs 156, 156' for serving as a word line and a bit line or being electrically connected to other elements of the DRAM 100.

Please refer to FIG. 2 to FIG. 10. FIG. 2 to FIG. 10 are schematic diagrams of the fabrication method of the vertical DRAM 100 shown in FIG. 1 according to the present invention. At first, a first ion implanting process is performed to form the P-type well 112 in the substrate 110. And a second ion implanting process is performed to form a buried plate 114 in the P-type well. A pad oxide layer 116 and a pad nitride layer 118 are then sequentially formed on the surface of the substrate 110. After that, a photolithography-etching process (PEP) is performed to form the deep trench 120 in the substrate 110.

Figure 3:
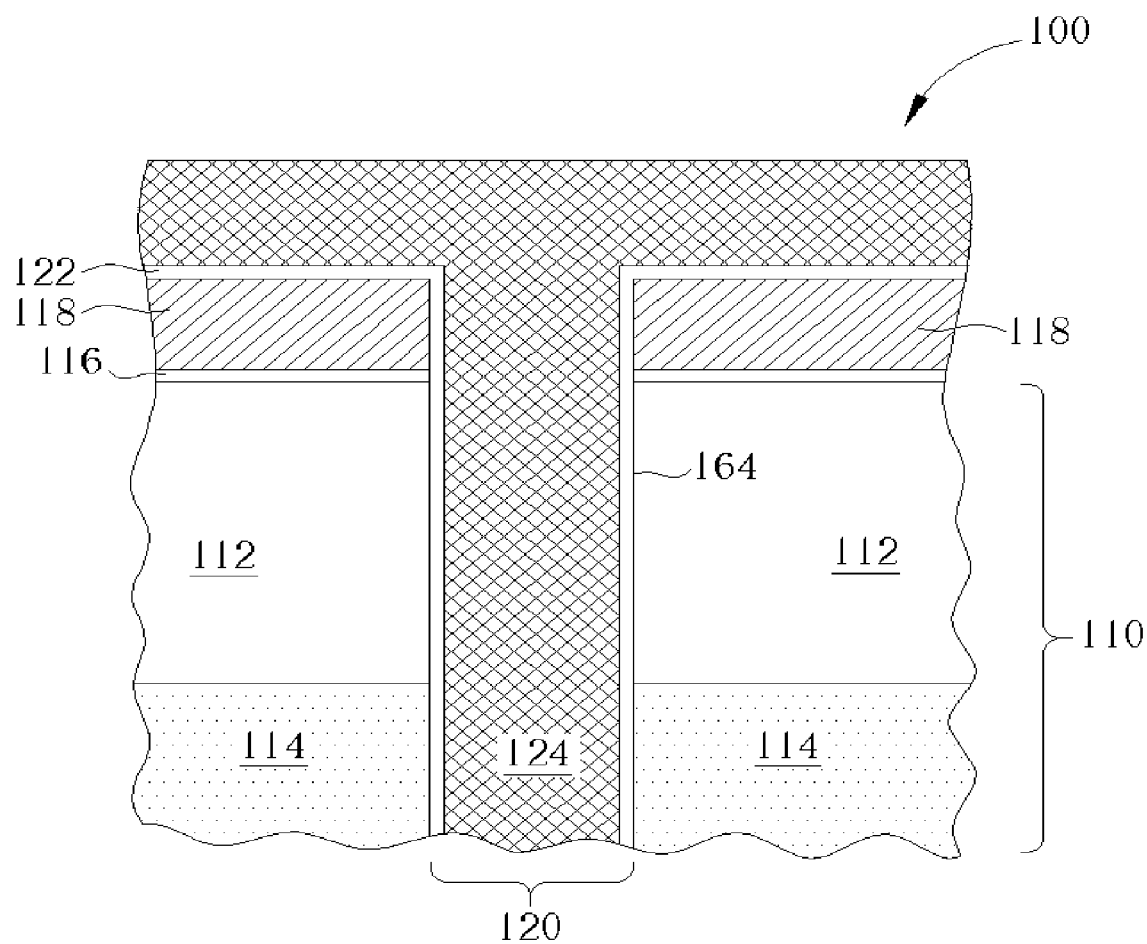
Figure 4:
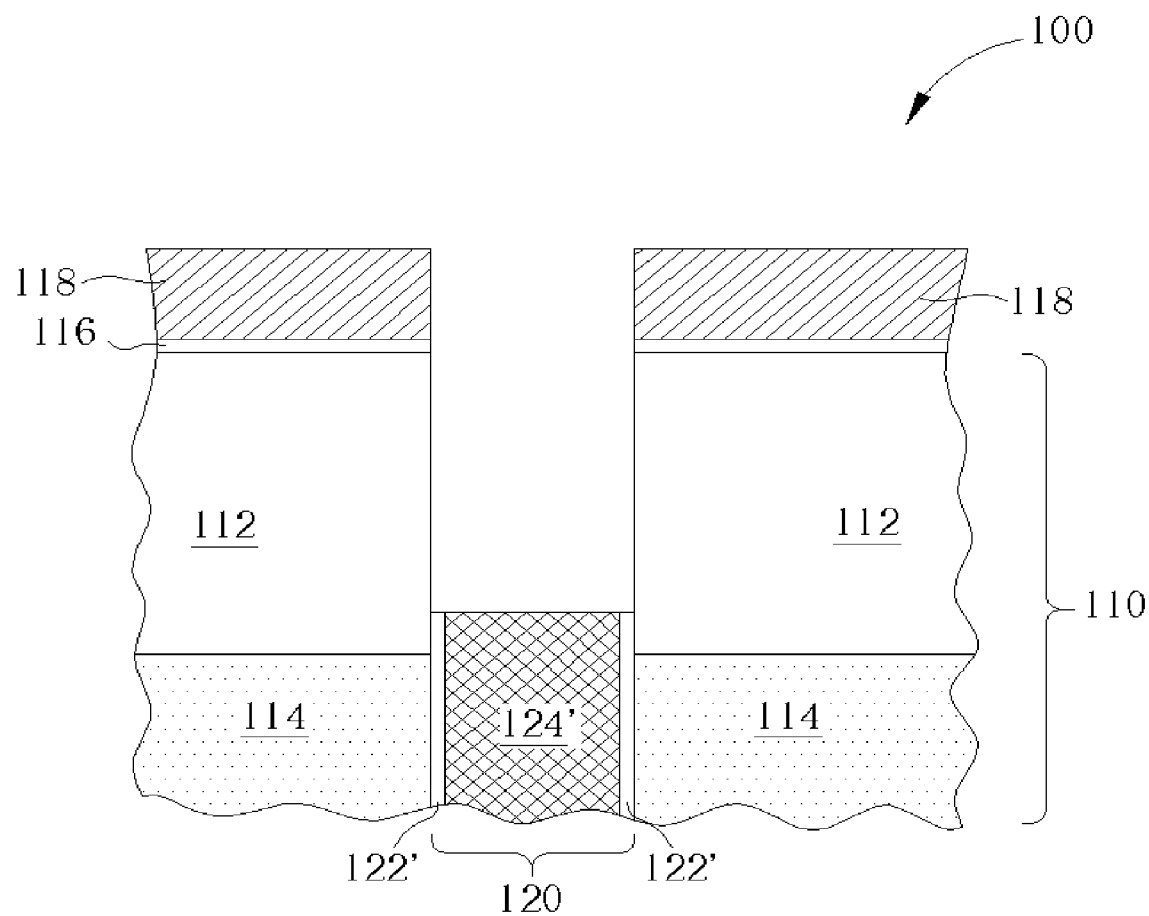

Please refer to FIG. 3, a chemical vapor deposition (CVD) process is performed to deposit a first dielectric layer 122 on the surface of the substrate 110 and the deep trench 120, and then a first doped polysilicon layer 124 is formed on the first dielectric layer 122. Referring to FIG. 4, a recess etching (RE) process is performed to remove a portion of the first doped polysilicon layer 124 and the first dielectric layer 122 to form a capacitor dielectric layer 122' in the lower trench portion 162 of the deep trench 120 and a storage node 124' encompassed by the capacitor dielectric layer 122'. In another embodiment of the present invention, the capacitor dielectric layer 122' may be an oxide-nitride (ON) dielectric layer or other materials with a high dielectric constant.

Figure 5:
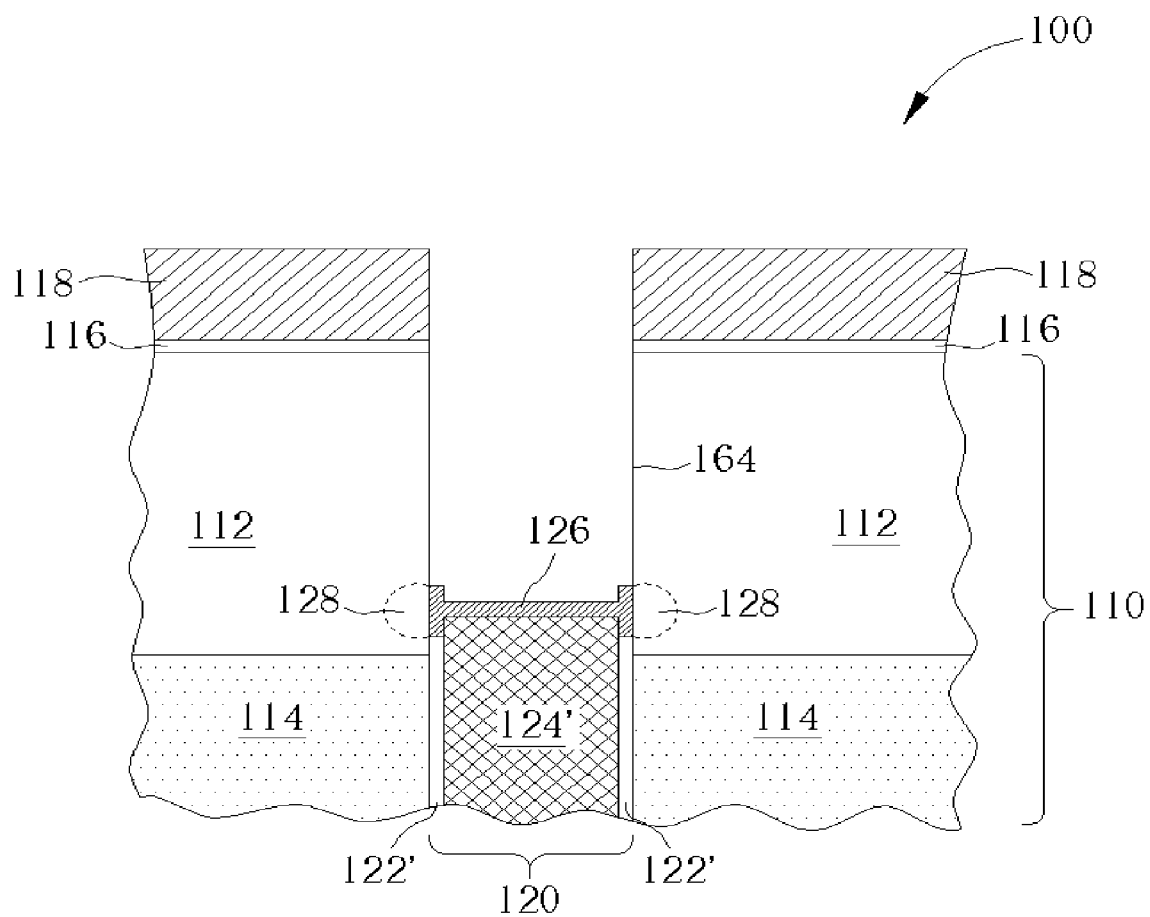

Please refer to FIG. 5. An arsenic doped polysilicon (As-doped poly) layer (not shown) is deposed on the sidewall of the deep trench 120. Then, a portion of the As-doped poly layer is removed to leave the As-doped poly layer 126 on the capacitor dielectric layer 122' and the storage node 124'. It can be done by depositing a photoresist layer after the As-doped poly layer is formed, performing an etching-back process to remove a portion of the photoresist layer so that the remaining photoresist layer has a predetermined thickness, performing a wet etching process to the As-doped poly layer, and removing the remaining photoresist layer. Then, a heat diffusion process is performed to diffuse the arsenic ions of the As-doped poly layer 126 into the substrate 110 next to the As-doped poly layer 126. Therefore a first ion diffusion area, the annular source 128, encompassing the deep trench 120 is formed. After that, the As-doped poly layer 126 on the storage node 124' is removed, only a strap of the As-doped poly layer 126 above the capacitor dielectric layer 122' on the trench sidewall 164 being left, which is the buried strap 126', as shown in FIG. 6.

Figure 6:
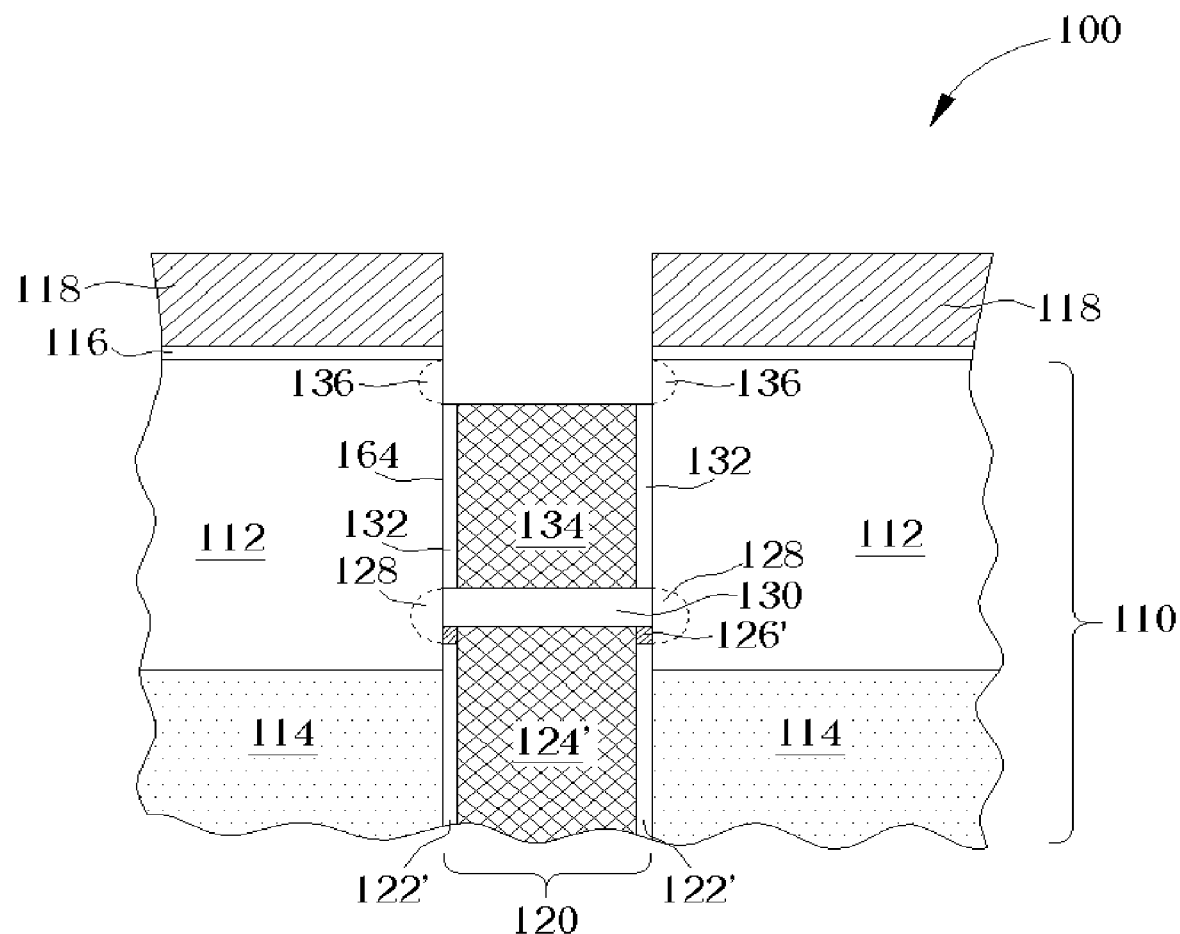

Please refer to FIG. 6. A source-isolation oxide layer 130 is formed in the deep trench 120 for isolating the annular source 128 and other conductive material in the deep trench 120. The source-isolation oxide layer 130 can be formed by performing a CVD process to deposit an oxide layer in the deep trench 120, forming a photoresist layer on the oxide layer, then, etching back the photoresist layer, performing a wet etching process and a dry etching process by using the remaining photoresist layer as a hard mask to remove a portion of the oxide layer, and removing the remaining photoresist layer. On the other hand, the source-isolation oxide layer 130 also can be formed by performing a high density plasma (HDP) process to deposit an oxide layer in the deep trench 120 and an isotropic etching process to etch back the oxide layer to form a source-isolation oxide layer 130. After the source-isolation oxide layer 130 is formed, an oxidation process is performed to oxide the trench sidewall 164 above the source-isolation oxide layer 130 so as to form the cylindrical gate dielectric layer 132. Second doped polysilicon layer (not shown) is deposited on the substrate 110. Then, a CMP process and a RE process are performed to remove a portion of the second doped polysilicon layer so that the surface of the second doped polysilicon layer is lower than the surface of the substrate 110, and therefore the gate conductive layer 134 is formed. A wet etching process is then performed to remove a portion of the cylindrical gate dielectric layer 132 located above the gate conductive layer 134 so as to expose the top trench sidewall 164 near the surface of the substrate 110. An As-doped poly layer(not shown) is formed, and a heat diffusion process is then performed to diffuse the arsenic ions of the As-doped poly layer into the exposed trench sidewall 164 and the substrate 110. Therefore a second ion diffusion area, the annular drain 136, is formed. After that, the As-doped poly layer is removed.

Figure 7:
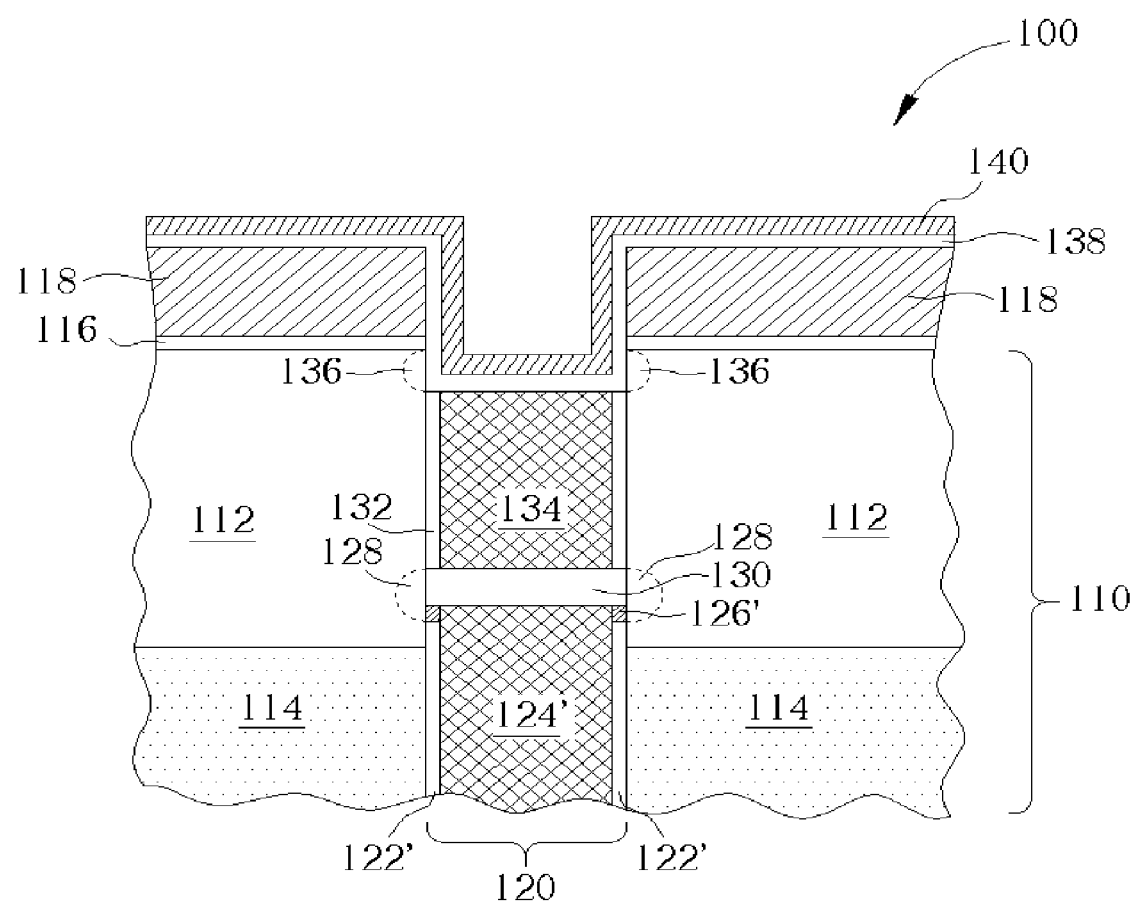
Figure 8:
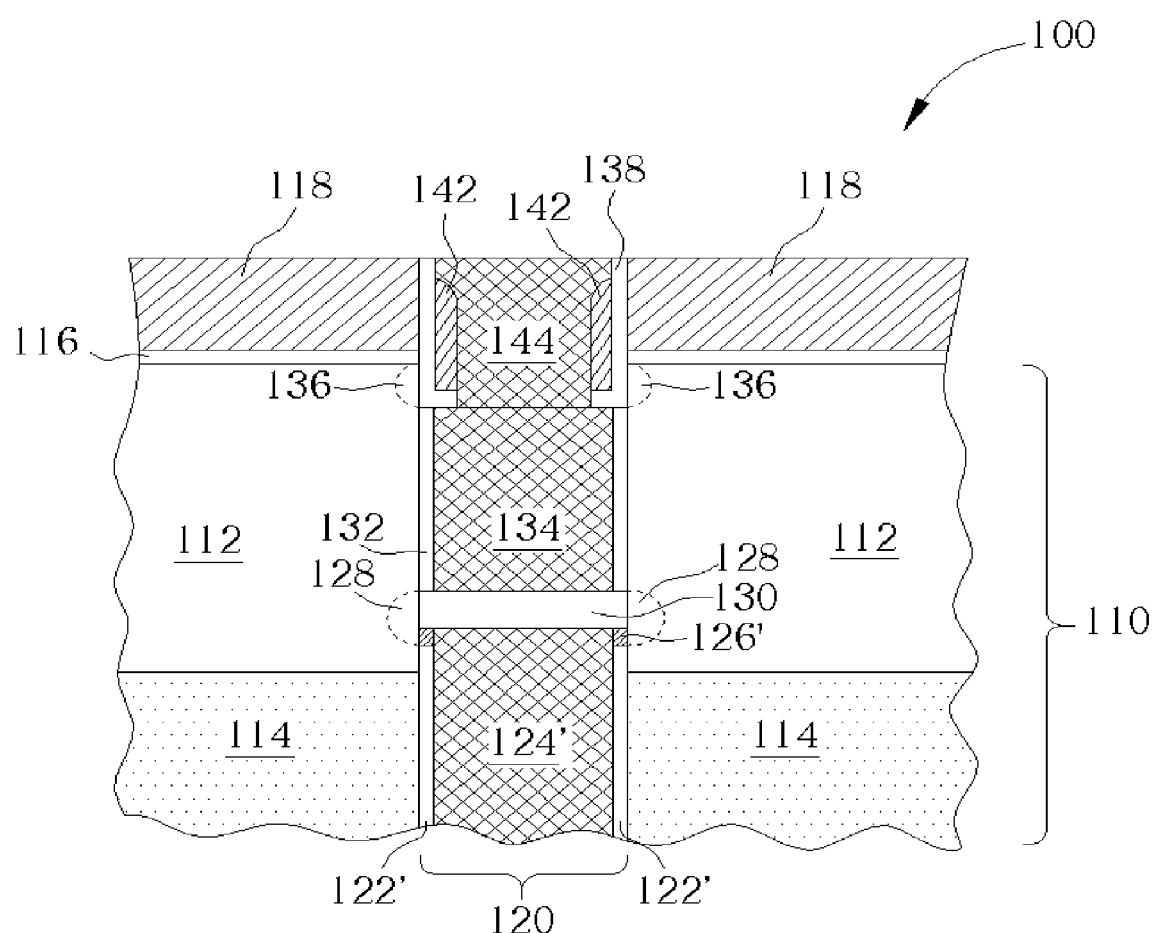

Please refer to FIG. 7. A liner oxide layer 138 and a liner nitride layer 140 are sequentially deposited on the surface of the substrate 110 and the deep trench 120. Referring to FIG. 8, an-isotropic process is performed to remove a portion of the liner nitride layer 140 to expose a portion of the liner oxide layer 138 and form a spacer 142 on the sidewall of the liner oxide layer 138 and the upper portion of the deep trench 120. An dry etching process is then performed to remove the liner oxide layer 138 not covered by the spacer 142 to expose the gate conductive layer 134 in the deep trench 120. After that, a third doped polysilicon layer is filled into the deep trench 120 so as to form the polysilicon conductive layer 144, wherein the exposed polysilicon conductive layer 144 is electrically connected to the gate conductive layer 134.

Figure 9:
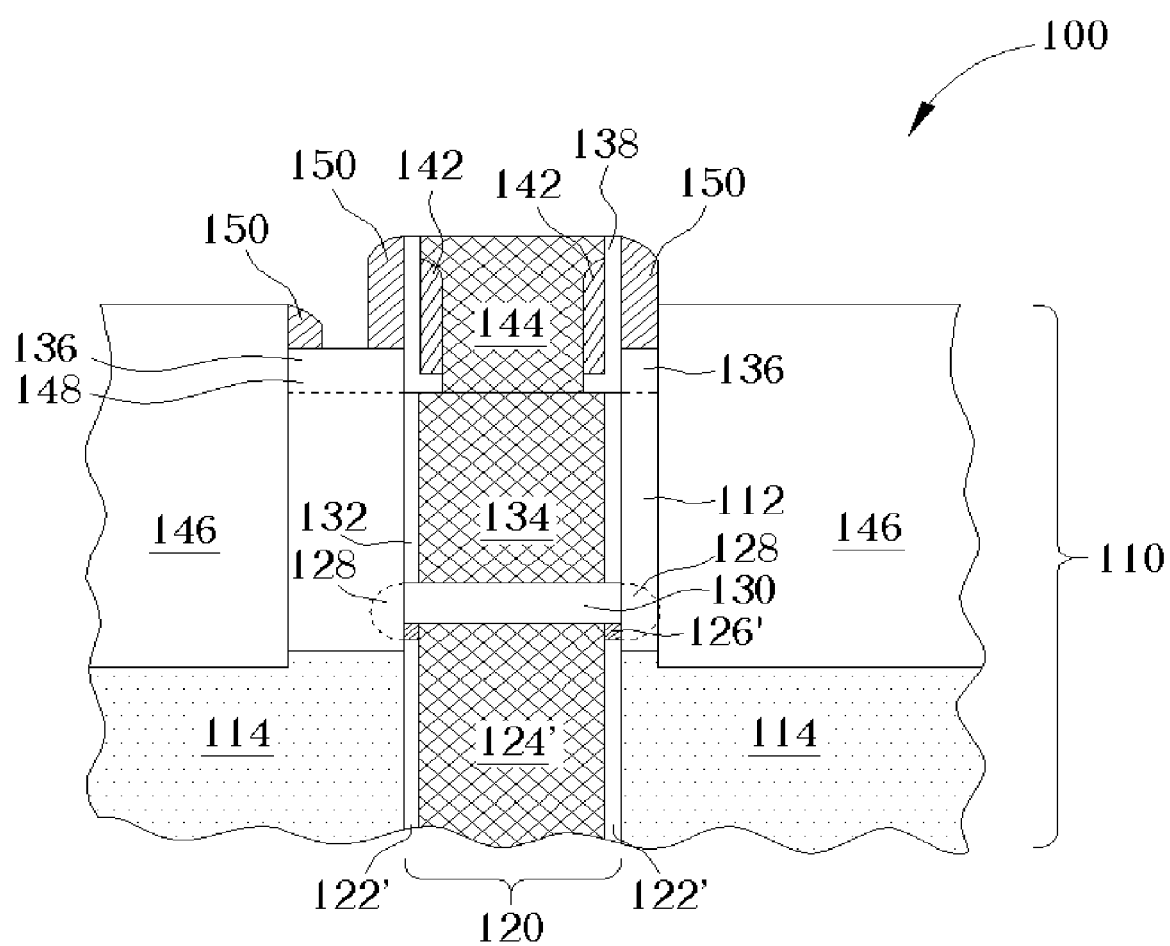

Referring to FIG. 9, a STI 146 is formed in the substrate 110 near the deep trench 120. It can be executed by performing a PEP to form a shallow trench near the deep trench 120, forming an isolation layer on the substrate 110 and filling the isolation layer in the shallow trench, and finally performing a CVP process by taking the pad nitride layer 118 as the stopping layer. Then, the pad nitride layer 118 is removed. An ion implanting process is performed at the exposed pad oxide layer 116 so as to form a heavily doped ion implantation area at the second ion diffusion area, which overlaps the annular drain 136. After that, a nitride layer (not shown) is formed. A sidewall etching process is then performed to remove the nitride layer and a portion of the STI 146 so as to form the spacer 150 on the sidewall of the liner oxide layer 138 and the STI 146.

Figure 10:
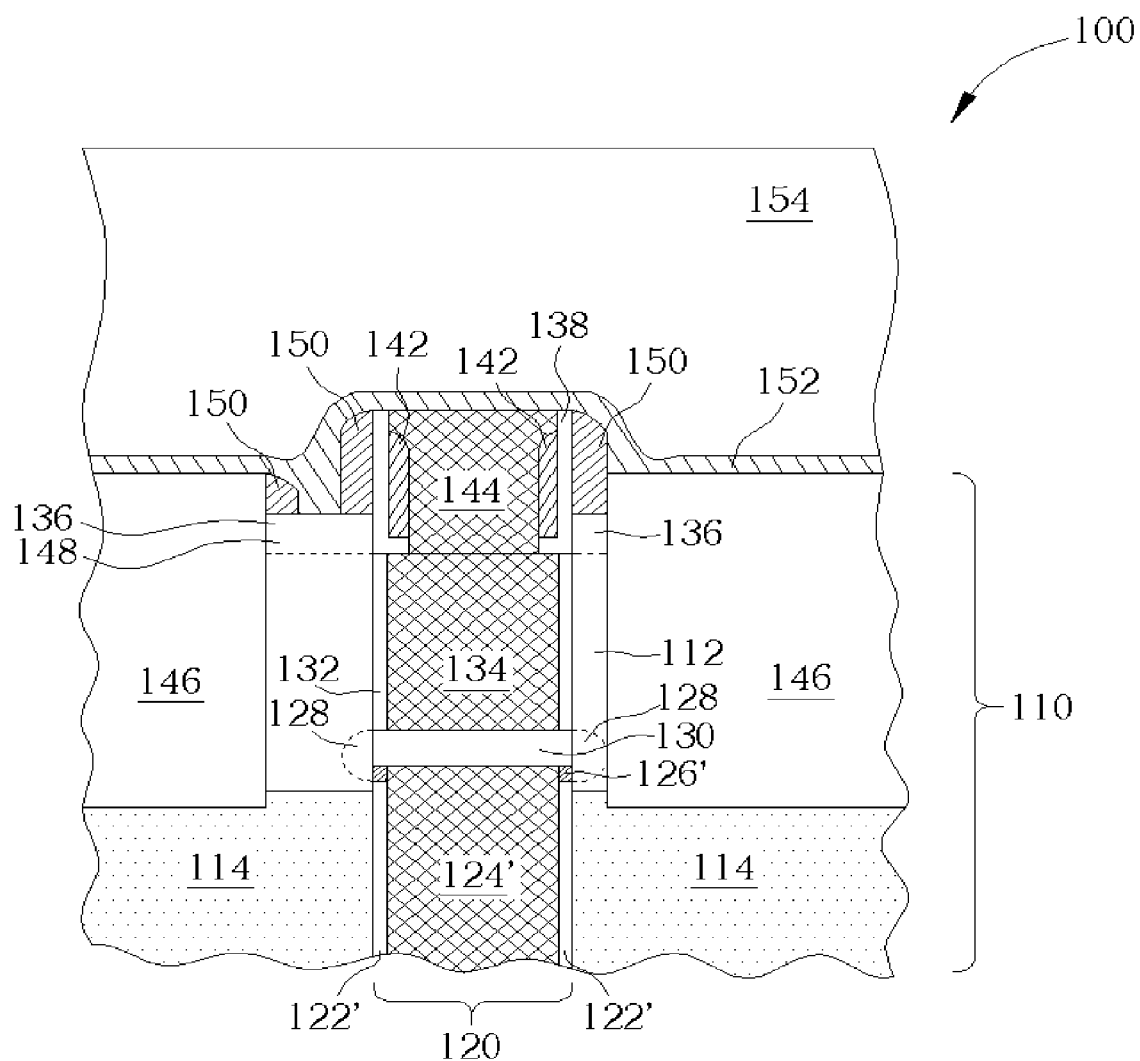

Please refer to FIG. 10. A nitride layer is formed on the surface of the substrate 110 for being a passivation layer 152. An ILD layer 154 is deposited on the substrate 110 with a material of silicon oxide or other dielectric materials. Then, a PEP is performed to form a plurality of contact holes in the ILD layer 154 and the passivation layer 152 so as to expose a portion of the annular drain 136 and the polysilicon conductive layer 144. A metal layer or a doped polysilicon layer is filled in the contact holes to form the contact plugs 156, 156'. Finally, according to the circuit design of the DRAM, other elements can be continuously fabricated on the surface of the substrate 110. For example, the following processes may comprise depositing a metal layer 158, performing a PEP to remove a portion of the metal layer 158, and electrically connecting the remaining metal layer 158 to the contact plugs 156, 156', wherein the metal layer 158 can be used as a bit line, a word line, or a conductive element for other DRAM elements. Therefore the vertical DRAM 100 in FIG. 1 is completed.

In contrast to the prior art, the present invention vertical DRAM has a deep trench capacitor arranged in a staggered configuration with respect to the STI. Therefore the vertical transistor has an annular channel for gaining a higher sufficient current. Furthermore, the present invention vertical DRAM has asymmetric contact plug structure on the gate and annular drain. As shown in FIG. 1, the contact plug 156 is located across on the STI 146 and the annular drain 136, and the contact plug 156' is located at the right side on the gate conductive layer 144. Therefore it can be fabricated by a self-alignment process so as to increase the process window.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A vertical dynamic random access memory (DRAM) comprising:
   a substrate comprising at least a deep trench having an upper trench portion and a lower trench portion;
   an annular spacer surrounding the upper trench portion;
   a trench capacitor located in the lower trench portion;
   a source-isolation oxide layer located on the trench capacitor;
   a shallow trench isolation (STI) positioned around the deep trench; and
   a vertical transistor located on the source-isolation oxide layer, the vertical transistor comprising:
      an annular source set in the substrate next to the source-isolation oxide layer, the annular source being electrically connected to the trench capacitor;
      a gate conductive layer filling the upper trench portion and electrically connected to a first contact plug;
      a cylindrical gate dielectric layer located on a surface of a sidewall of the upper trench portion and circularly encompassing the gate conductive layer; and
      an annular drain circularly encompassing the deep trench near a surface of the substrate, the annular drain being positioned next to the STI and electrically connected to a second contact plug, the STI completely compassing the vertical transistor and separating the annular drain from other annular drains of any adjacent vertical transistors in the substrates, the second contact plug having an asymmetric structure, which is positioned on the annular spacer and the annular drain while contacts the spacer and the annular drain at the same time.

2. The vertical DRAM of claim 1, wherein the trench capacitor comprises:
   a storage node filling the lower trench portion and electrically connected to the annular source;
   a capacitor dielectric layer encompassing the storage node; and
   a buried plate located in the substrate in a side of the capacitor dielectric layer.

3. The vertical DRAM of claim 2, wherein the buried plate surrounds a sidewall of the lower trench portion, and the capacitor dielectric layer is located on a surface of the sidewall of the lower trench portion so as to isolate the storage node and the buried plate.

4. The vertical DRAM of claim 2, wherein the trench capacitor further comprises a buried strap for electrically connecting the annular source and the storage node.

5. The vertical DRAM of claim 4, wherein the buried strap is an annular conductive strap located on the inner surface of the sidewall of the lower trench portion above the capacitor dielectric layer.

6. The vertical DRAM of claim 1, wherein the vertical DRAM further comprises a conductive layer located on the gate conductive layer for electrically connecting the gate conductive layer and the first contact plug.

7. The vertical DRAM of claim 1, wherein the annular source is an ion diffusion area.

8. The vertical DRAM of claim 1, wherein the annular drain overlaps a heavily doped ion implantation area.

9. The vertical DRAM of claim 1, wherein the vertical DRAM Further comprises a passivation layer covering the surface of the substrate and the transistor.

10. The vertical DRAM of claim 1, wherein the first and the second contact plug are electrically connected to a word line and a bit line respectively.

11. The vertical DRAM of claim 1, wherein the shallow trench isolation surrounds the annular source and the annular drain without overlapping the deep trench.

12. The vertical DRAM of claim 1, wherein the second contact plug is positioned on a portion of the STI and directly contacts the STI and the annular spacer near the STI at the same time.

13. The vertical DRAM of claim 1, wherein the annular spacer positioned on an outer surface of the sidewall of the upper trench portion.

14. The vertical DRAM of claim 1, wherein the annular drain around the sidewall of the deep trench has an asymmetric structure, a portion of the annular drain positioned below the second contact plug having a larger width from the STI to the deep trench than a width of a portion of the annular drain not positioned below the second contact plug.

* * * * *